United States Patent
McMenamy

(10) Patent No.: US 8,035,455 B1
(45) Date of Patent: Oct. 11, 2011

(54) OSCILLATOR AMPLITUDE CONTROL NETWORK

(75) Inventor: Michael McMenamy, Tensed, ID (US)

(73) Assignee: Cypress Semiconductor Corporation, San Jose, CA (US)

( * ) Notice: Subject to any disclaimer, the term of this patent is extended or adjusted under 35 U.S.C. 154(b) by 729 days.

(21) Appl. No.: 11/540,216

(22) Filed: Sep. 29, 2006

Related U.S. Application Data

(60) Provisional application No. 60/752,803, filed on Dec. 21, 2005.

(51) Int. Cl.
*H03B 5/32* (2006.01)

(52) U.S. Cl. .................... 331/109; 331/183; 331/160

(58) Field of Classification Search ............... 331/183, 331/182, 109, 160, 158
See application file for complete search history.

(56) References Cited

U.S. PATENT DOCUMENTS

| | | |
|---|---|---|
| 2,671,896 A | 3/1954 | DeRosa |
| 2,953,780 A | 9/1960 | Goldfischer |
| 3,569,867 A | 3/1971 | Ernst |
| 3,689,754 A | 9/1972 | LeFebre |
| 3,740,588 A | 6/1973 | Stratton et al. |
| 3,831,113 A | 8/1974 | Ahmed |
| 3,868,597 A | 2/1975 | Gollinger |
| 3,878,527 A | 4/1975 | Rensin et al. |
| 3,940,760 A | 2/1976 | Brokaw |
| 4,013,979 A | 3/1977 | Vittoz |
| 4,061,987 A | 12/1977 | Nagahama |
| 4,121,162 A | 10/1978 | Alberkrack et al. |
| 4,138,671 A | 2/1979 | Comer et al. |
| 4,223,524 A | 9/1980 | Nakagawa |
| 4,230,953 A | 10/1980 | Wilcox |
| 4,242,604 A | 12/1980 | Smith |
| 4,250,464 A | 2/1981 | Schade, Jr. |
| 4,272,760 A | 6/1981 | Prazak et al. |
| 4,344,067 A | 8/1982 | Lee |
| 4,397,211 A | 8/1983 | Ferdinand |
| 4,397,945 A | 8/1983 | Shum et al. |
| 4,479,216 A | 10/1984 | Krambeck et al. |
| 4,492,934 A | 1/1985 | Sugimoto |
| 4,527,075 A | 7/1985 | Zbinden |
| 4,578,649 A | 3/1986 | Shupe |
| 4,588,968 A | 5/1986 | Wile |
| 4,609,884 A | 9/1986 | Kindinger et al. |
| 4,646,031 A | 2/1987 | Fast et al. |
| 4,689,581 A | 8/1987 | Talbot |
| 4,689,740 A | 8/1987 | Moelands et al. |
| 4,692,718 A | 9/1987 | Roza et al. |
| 4,710,730 A | 12/1987 | Doyle, III |

(Continued)

FOREIGN PATENT DOCUMENTS

EP 368398 A1 5/1990

(Continued)

OTHER PUBLICATIONS

U.S. Appl. No. 10/949,902, McMenamy, Michael.

(Continued)

*Primary Examiner* — Joseph Chang

(57) ABSTRACT

An amplitude control circuit (100) can include a peak level detect circuit (102) that generates a peak voltage signal (Vpeak') based on a peak level of signal Xosc. An amplitude bias control circuit (104) can generate a bias voltage Vbc that can correspond to a peak amplitude of a received oscillator signal Xosc, and can change according to variations in a transistor threshold voltage due to process, operating conditions and voltage.

20 Claims, 4 Drawing Sheets

U.S. PATENT DOCUMENTS

| | | | |
|---|---|---|---|
| 4,736,123 A | 4/1988 | Miyazawa et al. |
| 4,771,251 A | 9/1988 | Allen et al. |
| 4,788,466 A | 11/1988 | Paul et al. |
| 4,797,580 A | 1/1989 | Sunter |
| 4,855,683 A | 8/1989 | Troudet et al. |
| 4,868,525 A | 9/1989 | Dias |
| 4,882,549 A | 11/1989 | Galani et al. |
| 4,943,788 A | 7/1990 | Laws et al. |
| 4,947,169 A | 8/1990 | Smith et al. |
| 4,956,618 A | 9/1990 | Ulmer |
| 4,959,557 A | 9/1990 | Miller |
| 4,970,472 A | 11/1990 | Kennedy et al. |
| 4,977,381 A | 12/1990 | Main |
| 4,980,653 A | 12/1990 | Shepherd |
| 4,996,444 A | 2/1991 | Thomas et al. |
| 5,019,729 A | 5/1991 | Kimura et al. |
| 5,036,294 A | 7/1991 | McCaslin |
| 5,036,300 A | 7/1991 | Nicolai |
| 5,084,685 A | 1/1992 | Moller et al. |
| 5,095,280 A | 3/1992 | Wunner et al. |
| 5,103,675 A | 4/1992 | Komninos |
| 5,111,081 A | 5/1992 | Atallah |
| 5,117,206 A | 5/1992 | Imamura |
| 5,126,692 A | 6/1992 | Shearer et al. |
| 5,132,642 A | 7/1992 | Bush et al. |
| 5,138,281 A | 8/1992 | Boudewijns |
| 5,140,197 A | 8/1992 | Grider |
| 5,142,247 A | 8/1992 | Lada, Jr. et al. |
| 5,144,254 A | 9/1992 | Wilke |
| 5,144,264 A | 9/1992 | Chong et al. |
| 5,148,447 A | 9/1992 | Ito |
| 5,150,079 A | 9/1992 | Williams et al. |
| 5,151,613 A | 9/1992 | Satou et al. |
| 5,175,884 A | 12/1992 | Suarez |
| 5,182,528 A | 1/1993 | Zuta |
| 5,196,810 A | 3/1993 | Graether et al. |
| 5,200,751 A | 4/1993 | Smith |
| 5,202,687 A | 4/1993 | Distinti |
| 5,204,559 A | 4/1993 | Deyhimy et al. |
| 5,204,877 A | 4/1993 | Endo et al. |
| 5,212,412 A | 5/1993 | Atriss et al. |
| 5,226,058 A | 7/1993 | Anderson et al. |
| 5,235,617 A | 8/1993 | Mallard, Jr. |
| 5,250,911 A | 10/1993 | Linder et al. |
| 5,254,955 A | 10/1993 | Saeki et al. |
| 5,268,599 A | 12/1993 | Matsui |
| 5,289,138 A | 2/1994 | Wang |
| 5,302,920 A | 4/1994 | Bitting |
| 5,304,955 A | 4/1994 | Atriss et al. |
| 5,307,071 A | 4/1994 | Arnold et al. |
| 5,319,370 A | 6/1994 | Signore et al. |
| 5,321,319 A | 6/1994 | Mahmood |
| 5,331,296 A | 7/1994 | Davis |
| 5,345,195 A | 9/1994 | Cordoba et al. |
| 5,347,173 A | 9/1994 | McAdams |
| 5,349,544 A | 9/1994 | Wright et al. |
| 5,355,033 A | 10/1994 | Jang |
| 5,355,097 A | 10/1994 | Scott et al. |
| 5,381,116 A | 1/1995 | Nuckolls et al. |
| 5,384,551 A | 1/1995 | Kennedy et al. |
| 5,386,152 A | 1/1995 | Naraki |
| 5,396,245 A | 3/1995 | Rempfer |
| 5,399,994 A | 3/1995 | Siniscalchi et al. |
| 5,406,592 A | 4/1995 | Baumert |
| 5,408,191 A | 4/1995 | Han et al. |
| 5,412,349 A | 5/1995 | Young et al. |
| 5,416,434 A | 5/1995 | Kootstra et al. |
| 5,418,497 A | 5/1995 | Martin |
| 5,420,543 A | 5/1995 | Lundberg et al. |
| 5,426,384 A | 6/1995 | May |
| 5,426,398 A | 6/1995 | Kuo |
| 5,428,319 A | 6/1995 | Marvin et al. |
| 5,436,938 A | 7/1995 | Pigeon |
| 5,436,939 A | 7/1995 | Co et al. |
| 5,440,305 A | 8/1995 | Signore et al. |
| 5,446,417 A | 8/1995 | Korhonen et al. |
| 5,446,867 A | 8/1995 | Young et al. |
| 5,451,912 A | 9/1995 | Torode |
| 5,457,433 A | 10/1995 | Westwick |
| 5,459,653 A | 10/1995 | Seto et al. |
| 5,473,285 A | 12/1995 | Nuckolls et al. |
| 5,481,179 A | 1/1996 | Keeth |
| 5,486,795 A | 1/1996 | Spence et al. |
| 5,488,627 A | 1/1996 | Hardin et al. |
| 5,491,458 A | 2/1996 | McCune, Jr. et al. |
| 5,495,205 A | 2/1996 | Parker et al. |
| 5,495,207 A | 2/1996 | Novof |
| 5,506,875 A | 4/1996 | Nuckolls et al. |
| 5,511,100 A | 4/1996 | Lundberg et al. |
| 5,525,933 A | 6/1996 | Matsuki et al. |
| 5,537,388 A | 7/1996 | Shinskey |
| 5,546,433 A | 8/1996 | Tran et al. |
| 5,552,748 A | 9/1996 | O'Shaughnessy |
| 5,554,942 A | 9/1996 | Herr et al. |
| 5,557,243 A | 9/1996 | Ho |
| 5,559,502 A | 9/1996 | Schutte |
| 5,563,553 A | 10/1996 | Jackson |
| 5,565,819 A | 10/1996 | Cooper |
| 5,568,097 A | 10/1996 | Holzer |
| 5,581,216 A | 12/1996 | Ruetz |
| 5,583,501 A | 12/1996 | Henrion et al. |
| 5,589,783 A | 12/1996 | McClure |
| 5,592,113 A | 1/1997 | Quiet et al. |
| 5,594,612 A | 1/1997 | Henrion |
| 5,600,280 A | 2/1997 | Zhang |
| 5,604,466 A | 2/1997 | Dreps et al. |
| 5,608,770 A | 3/1997 | Noguchi et al. |
| 5,610,550 A | 3/1997 | Furutani |
| 5,610,955 A | 3/1997 | Bland |
| 5,614,869 A | 3/1997 | Bland |
| 5,623,234 A | 4/1997 | Shaik et al. |
| 5,625,325 A | 4/1997 | Rotzoll et al. |
| 5,629,651 A | 5/1997 | Mizuno |
| 5,631,920 A | 5/1997 | Hardin |
| 5,633,766 A | 5/1997 | Hase et al. |
| 5,644,254 A | 7/1997 | Boudry |
| 5,666,118 A | 9/1997 | Gersbach |
| 5,668,506 A | 9/1997 | Watanabe et al. |
| 5,670,915 A | 9/1997 | Cooper et al. |
| 5,673,004 A | 9/1997 | Park |
| 5,675,813 A | 10/1997 | Holmdahl |
| 5,682,049 A | 10/1997 | Nguyen |
| 5,684,434 A | 11/1997 | Mann et al. |
| 5,686,863 A | 11/1997 | Whiteside |
| 5,687,201 A | 11/1997 | McClellan et al. |
| 5,689,196 A | 11/1997 | Schutte |
| 5,694,087 A | 12/1997 | Ferraiolo et al. |
| 5,699,020 A | 12/1997 | Jefferson |
| 5,699,024 A | 12/1997 | Manlove et al. |
| 5,703,537 A | 12/1997 | Bland et al. |
| 5,703,540 A | 12/1997 | Gazda et al. |
| 5,703,541 A | 12/1997 | Nakashima |
| 5,726,597 A | 3/1998 | Petty et al. |
| 5,748,048 A | 5/1998 | Moyal |
| 5,764,112 A | 6/1998 | Bal et al. |
| 5,770,965 A | 6/1998 | Gritt, Jr. et al. |
| 5,774,006 A | 6/1998 | Barel et al. |
| 5,796,312 A | 8/1998 | Hull et al. |
| 5,805,909 A | 9/1998 | Diewald |
| 5,818,370 A | 10/1998 | Sooch et al. |
| 5,821,821 A | 10/1998 | Ahdab et al. |
| 5,825,317 A | 10/1998 | Anderson et al. |
| 5,870,004 A | 2/1999 | Lu |
| 5,870,345 A | 2/1999 | Stecker |
| 5,872,464 A | 2/1999 | Gradinariu |
| 5,892,408 A | 4/1999 | Binder |
| 5,896,066 A | 4/1999 | Katayama et al. |
| 5,896,068 A | 4/1999 | Moyal |
| 5,896,069 A | 4/1999 | Williams et al. |
| 5,898,345 A | 4/1999 | Namura et al. |
| 5,933,058 A | 8/1999 | Pinto et al. |
| 5,939,949 A | 8/1999 | Olgaard et al. |
| 5,943,382 A | 8/1999 | Li et al. |
| 5,999,062 A | 12/1999 | Gilbert |
| 6,005,444 A | 12/1999 | Carpelan |
| 6,025,757 A | 2/2000 | Tsukagoshi et al. |
| 6,052,035 A | 4/2000 | Nolan et al. |

| | | | |
|---|---|---|---|
| 6,084,452 | A | 7/2000 | Drost et al. |
| 6,104,257 | A | 8/2000 | Mann |
| 6,140,880 | A | 10/2000 | Moyal et al. |
| 6,144,327 | A | 11/2000 | Distinti et al. |
| 6,157,265 | A | 12/2000 | Hanjani |
| 6,157,266 | A | 12/2000 | Tsai et al. |
| 6,157,270 | A | 12/2000 | Tso |
| 6,167,103 | A | 12/2000 | Hardin |
| 6,167,245 | A | 12/2000 | Welland et al. |
| 6,172,579 | B1 | 1/2001 | Dacus et al. |
| 6,177,843 | B1 | 1/2001 | Chou et al. |
| 6,181,218 | B1 | 1/2001 | Clark et al. |
| 6,191,660 | B1 | 2/2001 | Mar et al. |
| 6,198,360 | B1 | 3/2001 | Henrion |
| 6,211,739 | B1 | 4/2001 | Synder et al. |
| 6,215,835 | B1 | 4/2001 | Kyles |
| 6,240,123 | B1 | 5/2001 | Zhang et al. |
| 6,275,116 | B1 | 8/2001 | Abugharbieh et al. |
| 6,275,117 | B1 | 8/2001 | Abugharbieh et al. |
| 6,278,338 | B1 | 8/2001 | Jansson |
| 6,285,264 | B1 | 9/2001 | Mann |
| 6,294,962 | B1 | 9/2001 | Mar |
| 6,308,055 | B1 | 10/2001 | Welland et al. |
| 6,323,827 | B1 | 11/2001 | Cretti et al. |
| 6,326,853 | B1 | 12/2001 | Moyal et al. |
| 6,329,855 | B1 | 12/2001 | Horie |
| 6,345,079 | B1 | 2/2002 | Ohishi |
| 6,362,697 | B1 | 3/2002 | Pulvirenti |
| 6,388,479 | B1 | 5/2002 | Gupta et al. |
| 6,404,294 | B1 | 6/2002 | Sha et al. |
| 6,407,641 | B1 | 6/2002 | Williams et al. |
| 6,424,178 | B1 | 7/2002 | Harrison |
| 6,456,133 | B1 | 9/2002 | Nair et al. |
| 6,507,220 | B1 | 1/2003 | Groen et al. |
| 6,515,551 | B1 | 2/2003 | Mar et al. |
| 6,525,616 | B1 | 2/2003 | Williams |
| 6,542,015 | B2 | 4/2003 | Zhou et al. |
| 6,563,390 | B1 | 5/2003 | Kizziar |
| 6,563,391 | B1 | 5/2003 | Mar |
| 6,573,779 | B2 | 6/2003 | Sidiropoulos et al. |
| 6,657,501 | B1 | 12/2003 | Anil |
| 6,657,506 | B1 | 12/2003 | Maheshwari |
| 6,667,668 | B1 | 12/2003 | Henrion |
| 6,670,852 | B1 | 12/2003 | Hauck |
| 6,690,243 | B1 | 2/2004 | Henrion |
| 6,696,898 | B1 | 2/2004 | Ward et al. |
| 6,741,137 | B1 | 5/2004 | Sibrai et al. |
| 6,744,281 | B2 | 6/2004 | Harrison |
| 6,750,689 | B2 | 6/2004 | Fletcher et al. |
| 6,759,914 | B2 | 7/2004 | Rusznyak |
| 6,771,136 | B1 | 8/2004 | Reynolds |
| 6,784,757 | B2 | 8/2004 | Sibrai et al. |
| 6,798,301 | B1 | 9/2004 | Balan et al. |
| 6,812,802 | B1 | 11/2004 | Godambe et al. |
| 6,825,728 | B1 | 11/2004 | Beard et al. |
| 7,005,933 | B1 | 2/2006 | Shutt |
| 7,123,113 | B1 | 10/2006 | Brennan et al. |
| 7,187,245 | B1 * | 3/2007 | McMenamy ............... 331/158 |

FOREIGN PATENT DOCUMENTS

| | | | |
|---|---|---|---|
| EP | 0655829 | A1 | 5/1995 |
| EP | 0739089 | A1 | 10/1996 |
| JP | 287113 | A1 | 11/1988 |
| JP | 291161 | A1 | 11/1990 |
| JP | 297223 | A1 | 12/1991 |
| WO | WO 89/06456 | A1 | 7/1989 |
| WO | PCT/US96/17305 | A1 | 6/1996 |
| WO | WO 97/36230 | A1 | 10/1997 |
| WO | PCT/US98/34376 | A1 | 8/1998 |
| WO | PCT/US99/09712 | A1 | 2/1999 |

OTHER PUBLICATIONS

U.S. Appl. No. 60/506,265, McMenamy, Michael.
USPTO Notice of Allowance for U.S. Appl. No. 10/866,510 dated Jun. 16, 2006; 7 pages.
USPTO Non-Final Rejection for U.S. Appl. No. 10/866,510 dated Feb. 16, 2006; 10 pages.
USPTO Non-Final Rejection for Application No. 10/866,510 dated Sep. 26, 2005; 9 pages.
Bianchi et al., "Analog ALC Crystal Oscillators for High-Temperature Applications," IEEE Transactions on Solid-State Circuits, vol. 35, No. 1, Jan. 2000, pp. 2-14; 13 pages.
Margarit et al., "A Low-Noise, Low Power VCO with Automatic Amplitude Control for Wireless Applications," IEEE Journal of Solid-State Circuits, vol. 34, No. 6, Jun. 1999, pp. 761-771; 11 pages
Vittoz et al., "High-Performance Crystal Oscillator Circuits: Theory and Application," IEEE Journal of Solid-State Circuits, vol. 23, No. 3, Jun. 1988, pp. 774-783; 10 pages.
USPTO Notice of Allowance for U.S. Appl. No. 10/949,902 dated Oct. 5, 2006; 4 pages.
USPTO Notice of Allowance for U.S. Appl. No. 10/949,902 dated Apr. 27, 2006; 4 pages.
USPTO Ex Parte Quayle Action for U.S. Appl. No. 10/949,902 dated Dec. 13, 2005; 4 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 10/356,449 dated Jul. 14, 2004; 4 pages.
USPTO Non-Final Rejection for U.S. Appl. No. 10/356,449 dated Mar. 11, 2004; 5 pages.
USPTO Notice of Allowance for U.S. Appl. No. 10/013,869 dated Mar. 18, 2004; 6 pages.
USPTO Notice of Allowance for U.S. Appl. No. 10/013,869 dated Mar. 18, 2003; 5 pages.
Song et al., "A 50% Power Reduction Scheme for CMOS Relaxation Oscillator," 1999 IEEE, pp. 154-157; 4 pages.
U.S. Appl. No. 09/964,991: "A Novel Band-Gap Circuit for Providing an Accurate Reference Voltage Compensated for Process State, Process Variations and Temperature," Kutz et al., filed Sep. 26, 2001; 26 pages.
U.S. Appl. No. 09/957,084: "A Crystal-Less Oscillator Circuit with Trimmable Analog Current Control for Increased Stability," Mar et al., filed Sep. 19, 2001; 29 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for U.S. Appl. No. 09/957,084 dated Apr. 23, 2003; 8 pages.
USPTO Non-Final Rejection for U.S. Appl. No. 09/957,084 dated Aug. 23, 2002; 6 pages.
USPTO Notice of Allowance for U.S. Appl. No. 08/995,485 dated Mar. 29, 2000; 2 pages.
USPTO Non-Final Rejection for U.S. Appl. No. 08/995,485 dated Dec. 17, 1999; 7 pages.
USPTO Final Rejection for U.S. Appl. No. 08/995,485 dated Aug. 18, 1999; 9 pages.
USPTO Final Rejection for U.S. Appl. No. 08/995,485 dated Apr. 7, 1999; 5 pages.
USPTO Non-Final Rejection for U.S. Appl. No. 08/995,485 dated Oct. 27, 1998; 3 pages.
USPTO Notice of Allowance for U.S. Appl. No. 09/347,829 dated Jul. 28, 2000; 1 page.
USPTO Non-Final Rejection for U.S. Appl. No. 09/347,829 dated Apr. 20, 2000; 4 pages.
USPTO Notice of Allowance for U.S. Appl. No. 09/532,582 dated Aug. 30, 2001; 1 page.
USPTO Advisory Action for U.S. Appl. No. 09/532,582 dated Aug. 6, 2001; 1 page.
USPTO Final Rejection for U.S. Appl. No. 09/532,582 dated Jul. 16, 2001; 5 pages.

USPTO Non-Final Rejection for U.S. Appl. No. 09/532,582 dated Feb. 28, 2001; 6 pages.
USPTO Notice of Allowance for U.S. Appl. No. 09/753,063 dated Dec. 3, 2002; 2 pages.
USPTO Non-Final Rejection for U.S. Appl. No. 09/753,063 dated Jun. 26, 2002; 3 pages.
USPTO Non-Final Rejection for U.S. Appl. No. 09/753,063 dated Dec. 5, 2001; 3 pages.
USPTO Notice of Allowance for U.S. Appl. No. 09/842,966 dated Nov. 1, 2002; 4 pages.
USPTO Non-Final Rejection for U.S. Appl. No. 09/842,966 dated Jun. 6, 2002; 6 pages.
USPTO Notice of Allowance for U.S. Appl. No. 09/638,100 dated Apr. 12, 2001; 1 page.
USPTO Non-Final Rejection for U.S. Appl. No. 09/638,100 dated Nov. 30, 2000; 5 pages.
USPTO Notice of Allowance for U.S. Appl. No. 08/815,701 dated May 22, 1998; 3 pages.
USPTO Notice of Allowance for U.S. Appl. No. 08/766,389 dated Nov. 26, 1997; 3 pages.
USPTO Notice of Allowance for U.S. Appl. No. 09/159,908 dated May 24, 2000; 5 pages.
USPTO Final Rejection for U.S. Appl. No. 09/159,908 dated Jan. 14, 2000; 6 pages.
USPTO Non-Final Rejection for U.S. Appl. No. 09/159,908 dated Sep. 17, 1999; 7 pages.
USPTO Notice of Allowance for U.S. Appl. No. 09/216,460 dated Apr. 3, 2001; 3 pages.
USPTO Non-Final Rejection for U.S. Appl. No. 09/216,460 dated Nov. 22, 2000; 5 pages.
USPTO Non-Final Rejection for U.S. Appl. No. 09/216,460 dated Jul. 3, 2000; 6 pages.
USPTO Advisory Action for U.S. Appl. No. 09/216,460 dated May 17, 2000; 1 page.
USPTO Final Rejection for U.S. Appl. No. 09/216,460 dated Feb. 2, 2000; 6 pages.
USPTO Non-Final Rejection for U.S. Appl. No. 09/216,460 dated Sep. 2, 1999; 5 pages.
USPTO Notice of Allowance for U.S. Appl. No. 09/328,083 dated Mar. 23, 2001; 3 pages.
USPTO Final Rejection for U.S. Appl. No. 09/328,083 dated Jan. 3, 2001 ; 5 pages.
USPTO Non-Final Rejection for U.S. Appl. No. 09/328,083 dated Jul. 6, 2000; 4 pages.
USPTO Notice of Allowance for U.S. Appl. No. 09/383,328 dated Jun. 27, 2001; 1 page.
USPTO Advisory Action for U.S. Appl. No. 09/383,328 dated May 30, 2001; 1 page.
USPTO Final Rejection for U.S. Appl. No. 09/383,328 dated Mar. 23, 2001; 6 pages.
USPTO Non-Final Rejection for U.S. Appl. No. 09/383,328 dated Aug. 4, 2000; 5 pages.
USPTO Notice of Allowance for U.S. Appl. No. 09/320,057 dated Aug. 8, 2000; 1 page.
USPTO Non-Final Rejection for U.S. Appl. No. 09/320,057 dated May 12, 2000; 4 pages.
USPTO Notice of Allowance for U.S. Appl. No. 09/966,626 dated Oct. 10, 2002; 8 pages.
USPTO Final Rejection for U.S. Appl. No. 09/966,626 dated Jun. 26, 2002; 5 pages.
USPTO Non-Final Rejection for U.S. Appl. No. 09/966,626 dated Dec. 6, 2001; 6 pages.
USPTO Notice of Allowance for U.S. Appl. No. 09/511,019 dated Jan. 4, 2002; 4 pages.
USPTO Final Rejection for U.S. Appl. No. 09/511,019 dated Nov. 29, 2001; 5 pages.
USPTO Non-Final Rejection for U.S. Appl. No. 09/511,019 dated May 4, 2001; 5 pages.
USPTO Notice of Allowance for U.S. Appl. No. 09/618,706 dated Aug. 29, 2001; 1 page.
USPTO Non-Final Rejection for U.S. Appl. No. 09/618,706 dated May 17, 2001; 23 pages.
USPTO Notice of Allowance for U.S. Appl. No. 09/596,814 dated Jul. 17, 2003; 4 pages.
USPTO Non-Final Rejection for U.S. Appl. No. 09/596,814 (CD00043) dated Aug. 28, 2002; 4 pages.
USPTO Advisory Action for U.S. Appl. No. 09/596,814 dated Jan. 10, 2002; 2 pages.
USPTO Final Rejection for U.S. Appl. No. 09/596,814 dated Oct. 29, 2001; 6 pages.
USPTO Non-Final Rejection for U.S. Appl. No. 09/596,814 dated Jun. 22, 2001; 5 pages.
USPTO Notice of Allowance for U.S. Appl. No. 09/207,912 dated May 7, 2001; 3 pages.
USPTO Non-Final Rejection for U.S. Appl. No. 09/207,912 dated Jan. 26, 2001; 4 pages.
USPTO Advisory Action for U.S. Appl. No. 09/207,912 dated Dec. 22, 2000; 1 page.
USPTO Final Rejection for U.S. Appl. No. 09/207,912 dated Oct. 11, 2000; 5 pages.
USPTO Non-Final Rejection for U.S. Appl. No. 09/207,912 dated Apr. 19, 2000; 5 pages.
USPTO Non-Final Rejection for U.S. Appl. No. 09/207,912 dated Nov. 10, 1999; 6 pages.
USPTO Notice of Allowance for U.S. Appl. No. 09/275,336 dated Sep. 27, 2000; 1 page.
USPTO Final Rejection for U.S. Appl. No. 09/275,336 dated Aug.7, 2001; 5 pages.
USPTO Non-Final Rejection for U.S. Appl. No. 09/275,336 dated Apr. 21, 2000; 6 pages.
USPTO Notice of Allowance for U.S. Appl. No. 09/721,316 dated Sep. 23, 2002; 5 pages.
USPTO Final Rejection for U.S. Appl. No. 09/721,316 dated Apr. 24, 2001; 4 pages.
USPTO Non-Final Rejection for U.S. Appl. No. 09/721,316 dated Aug. 7, 2001; 3 pages.
USPTO Non-Final Rejection for U.S. Appl. No. 09/721,316 dated Apr. 24, 2001; 4 pages.
USPTO Notice of Allowance for U.S. Appl. No. 09/864,051 dated Jul. 14, 2003; 6 pages.
USPTO Non-Final Rejection for U.S. Appl. No. 09/864,051 dated Oct. 28, 2002; 6 pages.
USPTO Non-Final Rejection for U.S. Appl. No. 09/864,051 dated Apr. 25, 2002; 9 pages.
USPTO Notice of Allowance for U.S. Appl. No. 09/981,448 dated Aug. 7, 2003; 5 pages.
USPTO Final Rejection for U.S. Appl. No. 09/981,448 dated May 8, 2003; 9 pages.
USPTO Non-Final Rejection for U.S. Appl. No. 09/981,448 dated Nov. 6, 2002; 6 pages.
Horowitz et al., "TP 10:5: PLL Design for a 500 MB/s Interface," 1993 IEEE International Solid-State Circuits Conference, Feb. 1993, p. 93, 161, 282; 5 pages.
Fielder et al., "FP 15.1: A 1.0625Gbps Transceiver with 2x-Oversampling and Transmit Signal Pre-Emphasis," ISSCC Session, 1997, copied from Nov. 1999, pp. 186-187; 2 pages.
Chen et al., "FP 15.3: A 1.25 Gb/s, 460 mW CMOS Transceiver for Serial Data Communication," ISSCC Session, 1997, copied from Nov. 1999, pp. 190-191; 2 pages.
USPTO Notice of Allowance for U.S. Appl. No. 09/050,521 dated Oct. 19, 1998; 2 pages.
USPTO Non-Final Rejection for U.S. Appl. No. 09/050,521 dated Jul. 13, 1998; 7 pages.
USPTO Miscellaneous Action for U.S. Appl. No. 09/618,622 dated Nov. 15, 2005; 2 pages.
USPTO Notice of Allowance for U.S. Appl. No. 09/618,622 dated Jun. 21, 2005; 6 pages.
USPTO Final Rejection for U.S. Appl. No. 09/618,622 dated Apr. 5, 2005; 8 pages.
USPTO Non-Final Rejection for U.S. Appl. No. 09/618,622 dated Oct. 29, 2004; 7 pages.
USPTO Final Rejection for U.S. Appl. No. 09/618,622 dated Jun. 30, 2004; 9 pages.
USPTO Final Rejection for U.S. Appl. No. 09/618,622 dated Jun. 14, 2004; 9 pages.

USPTO Non-Final Rejection for U.S. Appl. No. 09/618,622 dated Feb. 23, 2004; 7 pages.
USPTO Non-Final Rejection for U.S. Appl. No. 09/618,622 dated Nov. 3, 2003; 7 pages.
USPTO Non-Final Rejection for U.S. Appl. No. 09/618,622 dated Jun. 16, 2003; 6 pages.
USPTO Non-Final Rejection for U.S. Appl. No. 11/237,393 dated Oct. 16, 2007; 9 pages.
Banu, "MOS Oscillators with Multi-Decade Tuning Range and Gigahertz Maximum Speed," IEEE Journal of Solid-State Circuits, vol. SC-23, Apr. 1988, pp. 474-479; 8 pages.
"AX ATM-SONET/SDH Transceiver," Cypress Semiconductor Corporation, Feb. 1994 Revised; 77 pages.
USPTO Notice of Allowance for U.S. Appl. No. 08/696,008 dated Sep. 22, 1998; 4 pages.
USPTO Non-Final Rejection for U.S. Appl. No. 08/696,008 dated Apr. 6, 1998; 12 pages.
USPTO Non-Final Rejection for U.S. Appl. No. 08/696,008 dated Oct. 3, 1997; 3 pages.
USPTO Notice of Allowance for U.S. Appl. No. 08/549,915 dated Apr. 8, 1997; 3 pages.
USPTO Non-Final Rejection for U.S. Appl. No. 08/549,915 dated May 24, 1996; 3 pages.
USPTO Notice of Allowance for U.S. Appl. No. 08/868,079 dated Nov. 14, 2000; 3 pages.
USPTO Final Rejection for U.S. Appl. No. 08/868,079 dated Sep. 20, 2000; 4 pages.
USPTO Non-Final Rejection for U.S. Appl. No. 08/868,079 dated Apr. 12, 2000; 6 pages.
USPTO Final Rejection for U.S. Appl. No. 08/868,079 dated Dec. 17, 1999; 7 pages.
USPTO Non-Final Rejection for U.S. Appl. No. 08/868,079 dated Jul. 1, 1999; 6 pages.
USPTO Advisory Action for U.S. Appl. No. 08/868,079 dated Mar. 26, 1999; 2 pages.
USPTO Final Rejection for U.S. Appl. No. 08/868,079 dated Jan. 22, 1998; 7 pages.
USPTO Non-Final Rejection for U.S. Appl. No. 08/868,079 dated Jan. 22, 1998; 7 pages.
"Universal Serial Bus Specification," Revision 1.0, Chapter 7, Jan. 1996, pp. 111-143; 34 pages.
USPTO Notice of Allowance for U.S. Appl. No. 09/593,522 dated Oct. 22, 2002; 4 pages.
USPTO Non-Final Rejection for U.S. Appl. No. 09/593,522 dated Apr. 5, 2002; 4 pages.
USPTO Non-Final Rejection for U.S. Appl. No. 09/593,522 dated Oct. 3, 2001; 4 pages.
CY7C63722123 CY7C63742/43 enCoRe USB Combination Low-Speed USB & PS/2 Peripheral Controller, Cypress Semiconductor Corporation, Revised May 2000; 48 pages.
CY7C63221/31 enCoRe USB Low-Speed USB Peripheral Controller, Cypress Semiconductor Corporation, Revised May 2000; 40 pages.
Sam Yinshang Sun, "An Analog PLL-Based Clock and Data Recovery Circuit with High Input Jitter Tolerance," Reprinted from IEEE Journal of Solid-State Circuits, vol. SC-24, pp. 325-330, Apr. 1989, pp. 383-385; 4 pages.
Robert A. Blauschild, "WP 3.5: An Integrated Time Reference," ISSCC94/Session 3, Analog Techniques/Paper WP 3.5, Feb. 1994, pp. 56-58; 4 pages.
Bakker et al., "Micropower CMOS Temperature Sensor with Digital Output," IEEE, Jul. 1996; 3 pages.
Beomsup et al., "A 30-MHz Hybrid Analog/Digital Clock Recovery Circuit in 2-um CMOS," IEEE Journal of Solid-State Circuits, vol. 25, No. 6, Dec. 1990, pp. 1385-1394; 10 pages.
USPTO Notice of Allowance for U.S. Appl. No. 07/943,708 dated May 26, 1994; 1 page.
USPTO Non-Final Rejection for U.S. Appl. No. 07/943,708 dated Nov. 3, 1993; 7 pages.
USPTO Ex Parte Quayle Action for U.S. Appl. No. 07/943,708 dated Jun. 15, 1993; 3 pages.
USPTO Notice of Allowance for U.S. Appl. No. 08/336,006 dated Aug. 25, 1995; 3 pages.
USPTO Non-Final Rejection for U.S. Appl. No. 08/336,006 dated May 3, 1995; 3 pages.
USPTO Notice of Allowance for U.S. Appl. No. 08/865,342 dated Sep. 16, 1998; 1 page.
USPTO Non-Final Rejection for U.S. Appl. No. 08/865,342 dated Apr. 8, 1998; 5 pages.
USPTO Non-Final Rejection for U.S. Appl. No. 08/865,342 dated Feb. 3, 1998; 3 pages.
USPTO Notice of Allowance for U.S. Appl. No. 09/048,905 dated May 29, 2002; 4 pages.
USPTO Final Rejection for U.S. Appl. No. 09/048,905 dated Feb. 8, 2002; 6 pages.
USPTO Non-Final Rejection for U.S. Appl. No. 09/048,905 dated Jul. 24, 2001; 10 pages.
USPTO Non-Final Rejection for U.S. Appl. No. 09/048,905 dated Feb. 15, 2001; 12 pages.
USPTO Non-Final Rejection for U.S. Appl. No. 09/048,905 dated Aug. 22, 2000; 12 pages.
USPTO Final Rejection for U.S. Appl. No. 09/048,905 dated Oct. 15, 1999; 8 pages.
USPTO Non-Final Rejection for U.S. Appl. No. 09/048,905 dated Jun. 3, 1999; 5 pages.
Cuppens et al., "An EEPROM for Microprocessors and Custom Logic," IEEE Journal of Solid-State Circuits, vol. SC-20, No. 2, Apr. 1985, pp. 603-608; 6 pages.
Electronic Engineering TIMES, "TI's Quantum Leap," Issue 517, Dec. 19, 1988, pp. 1 and 86; 2 pages.
Kazerounian et al., "A Single Poly EPROM for Custom CMOS Logic Applications," IEEE 1986 Custom Integrated Circuits Conference, 1986, pp. 59-62; 4 pages.
Takebuchi et al., "A Novel Integration Technology of EEPROM Embedded CMOS LOGIC VLSI Suitable for ASIC Applications," IEEE 1992 Custom Integrated Circuits Conference, 1992, pp. 9.6.1-9.6.4; 4 pages.
Cacharelis et al., "A Modular 1 um CMOS Single Polysilicon EPROM PLD Technology," Aug. 1988 IEEE, pp. 60-IEDM 88 to 63-IEDM 88; 4 pages.
Ohsaki et al., "A Planar Type EEPROM Cell Structure by Standard CMOS Process and Applications," VLSI Technology, Digest of Technical Papers, May 1993, pp. 55-66; 2 pages.
Ohsaki et al., "A Planar Type EEPROM Cell Structure by Standard CMOS Process for Integration with Gate Array, Standard Cell, Microprocessor and for Neural Chips," IEEE 1993 Custom Integrated Circuits Conference, 1993, pp. 23.6.1-23.6.4; 4 pages.
Ohsaki et al., "S (Single Poly Pure CMOS) EEPROM Embedded FPGA by News Ring Interconnection and Highway Path," IEEE 1994 Custom Integrated Circuits Conference, 1994, pp. 189-192; 4 pages.
Ohsaki et al., "A Single Poly EEPROM Cell Structure for Use in Standard CMOS Processes," IEEE Journal of Solid-State Circuits, vol. 29, No. 3, Mar. 1994, pp. 311-316; 6 pages.
Miyamoto et al., "An Experimental 5-V-Only 256-kbit CMOS EEPROM with a High-Performance Single-Polysilicon Cell," IEEE Journal of Solid State Circuits, vol. SC-21, No. 5, Oct. 1986, pp. 852-860; 9 pages.
Yoshikawa et al., "An EPROM Cell Structure for EPLD's Compatible with Single Poly-Si Gate Processes," IEEE Transactions on Electron Devices, vol. 37, No. 3, Mar. 1990, pp. 675-679; 5 pages.
USPTO Notice of Allowance for U.S. Appl. No. 08/259,323 dated Mar. 21, 1995; 1 page.
USPTO Non-Final Rejection for U.S. Appl. No. 08/259,323 dated Oct. 6, 1994; 7 pages.
T.J. Giles, "A University Frequency Synthesizer IC," Aug. 1979, Philips Telecommunication Review, vol. 37, No. 3, pp. 177-181; 6 pages.
Cypress Semiconductor Marketing Brochure, "Timing Technology Products," Published Nov. 1993, a publication of Cypress Semiconductor in San Jose, CA, pp. 5-7; 5 pages.
Hoe et al., "Cell and Circuit Design for Single-Poly EPROM," IEEE Journal of Solid-State Circuits, vol. 24, No. 4, Aug. 1989, pp. 1153-1157; 5 pages.

L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.

Frake et al., "A 9ns, Low Standby Power CMOS PLD with a Single-Poly EPROM Cell," 1989 IEEE International Solid-State Circuits Conference, Feb. 17, 1989, pp. 230-231 and 346; 3 pages.

Sugino et al., "Analysis of Writing and Erasing Procedure of Flotox EEPROM Using the New Charge Balance Condition (CBC) Model," NUPAD IV, May and Jun. 1992, pp. 65-69; 5 pages.

USPTO Notice of Allowance for U.S. Appl. No. 09/878,074 dated Jun. 3, 2003; 6 pages.

USPTO Final Rejection for U.S. Appl. No. 09/878,074 dated Mar. 18, 2003; 6 pages.

USPTO Non-Final Rejection for U.S. Appl. No. 09/878,074 dated Oct. 3, 2002; 5 pages.

USPTO Non-Final Rejection for U.S. Appl. No. 09/878,074 dated May 22, 2002; 6 pages.

USPTO Notice of Allowance for U.S. Appl. No. 10/042,782 dated Jul. 28, 2003; 6 pages.

USPTO Non-Final Rejection for U.S. Appl. No. 10/042,782 dated Apr. 2, 2003; 6 pages.

S.M. Sze, "Physics of Semiconductor Devices," 2nd Edition, John Wiley & Sons, New York, 1981, pp. 496-506; 13 pages.

USPTO Notice of Allowance for U.S. Appl. No. 08/377,269 dated Aug. 7, 1996; 3 pages.

USPTO Final Rejection for U.S. Appl. No. 08/377,269 dated Mar. 26, 1996; 4 pages.

USPTO Non-Final Rejection for U.S. Appl. No. 08/377,269 dated Sep. 1, 1995; 3 pages.

Savoj et al., "A 10Gb/s CMOS Clock and Data Recovery Circuit with Frequency Detection," ©IEEE 2001, 4 pgs.

* cited by examiner

OSCILLATOR AMPLITUDE CONTROL NETWORK

This application claims the benefit of U.S. provisional application Ser. No. 60/752,803 filed Dec. 21, 2005, the contents of which are incorporated by reference herein.

TECHNICAL FIELD

The present invention relates generally to oscillator circuits, and more particularly to circuits that control the amplitude of an oscillator output signal.

BACKGROUND OF THE INVENTION

In crystal oscillator circuits, a crystal can be driven at its resonant frequency to generate a high quality periodic signal. In such circuits it can be desirable to regulate the amplitude of the oscillator drive signal. Such amplitude regulation can increase the lifetime of the circuit. In addition, regulation can reduce the likelihood of harmonic mode oscillation, which can introduce higher, unwanted frequencies into the oscillator signal.

To better understand various features of the disclosed embodiments, a previously known amplitude control circuit will now be described. An amplitude control circuit is shown in FIG. 4, and designated by the general reference character 400. An amplitude control circuit 400 (or amplitude control loop ACL) can include an input section 402, a conversion section 404, an output drive section 406, and filter section 408. An input section 402 can generate a peak detection voltage representing a peak level of input signals inp and inn. In addition, input section 402 can generate an average current based on such signals.

A peak voltage value can be stored by a capacitor C41 at node 410. Such a value can be applied, via conversion section 404, to output drive section 406. This can generate an output signal at node 412. Such a signal can result in the generation of an output current for controlling an amplifier that drives a crystal.

A circuit like that of FIG. 4 is shown in co-pending provisional patent application Ser. No. 60/506,265, titled AMPLITUDE CONTROL FOR CRYSTAL OSCILLATOR, by Mike McMenamy, filed Sep. 25, 2003 and nonprovisional patent application Ser. No. 10/949,902, filed Sep. 24, 2004, having the same title and inventor.

A drawback to an arrangement like that of FIG. 4 can be that at lower supply voltages, such a circuit may not provide a correct amplitude control.

DETAILED DESCRIPTION

Various embodiments of the present invention will now be described in detail with reference to a number of drawings. The embodiments show circuits that can serve as amplitude control circuits within oscillator circuits, more particularly, within crystal oscillator circuits.

Figure 1:
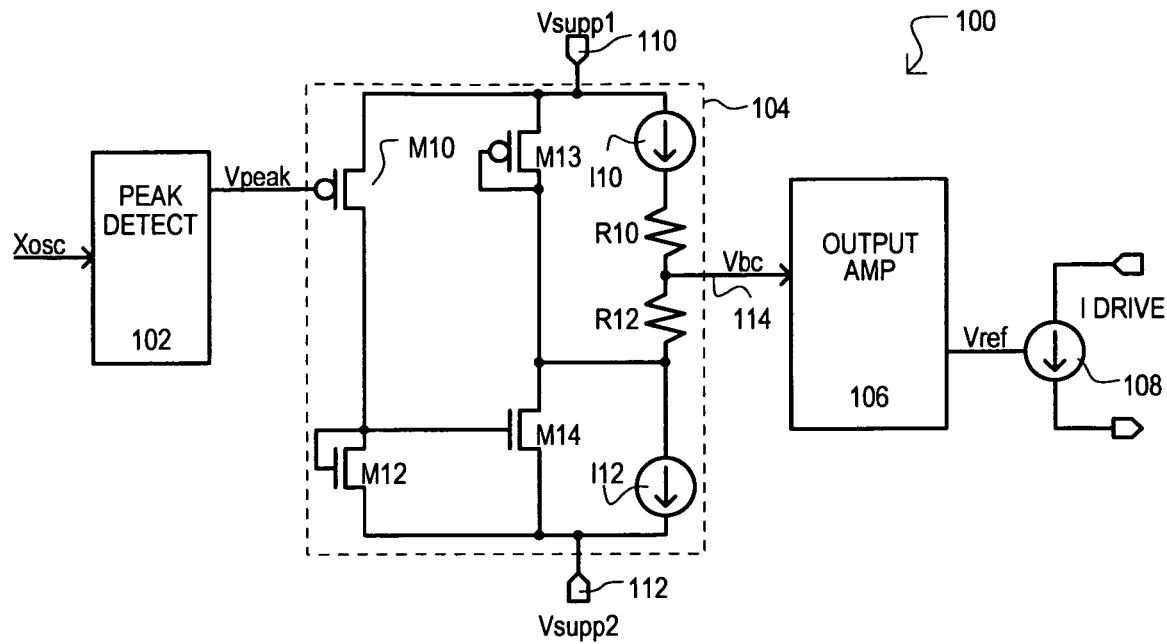
FIG. 1 is a block schematic diagram of an amplitude control circuit according to a first embodiment of the present invention.

An amplitude control circuit according to a first embodiment is set forth in block schematic diagram in FIG. 1, and designated by the general reference character 100. An amplitude control circuit 100 can include a peak level detect circuit 102, an amplitude bias control circuit 104, an output amplifier 106, and an amplifier drive current source 108.

A peak level detect circuit 102 can receive an oscillator signal (Xosc) from an oscillator source, such as a crystal, as but one example. A peak level detect circuit 102 can determine a peak voltage value (Vpeak) based on a peak level of signal Xosc. A peak voltage can be a maximum level of a signal Xosc with respect to a predetermined voltage. More particularly, a peak voltage can be a maximum difference of signal Xosc with respect to a power supply level, even more particularly, with respect to a high power supply voltage.

A gain and level shifting circuit 104 can include an input bias control transistor M10, a current mirror that includes M12 and M14, a diode connected load device M13, a first current source 110, a resistance R10, a resistance R12, and a second current source I12. A bias control transistor M10 can have a source connected to a first power supply node 110, a gate connected to the output of the peak level detect circuit 102, and a drain connected to a diode connected transistor M12. A current mirroring transistor M14 can have a source connected to second power supply node 112, its gate connected to diode device M12, and a drain connected to diode connected transistor M13, a resistor R12, and a current source I12. A first current source I10 can provide a current to a resistor R10. Resistance R10 can be connected between current source I10 and a bias control node 114. A resistance R12 can be connected between node 114 and current source I12.

In such an arrangement, in response to a variation in a peak voltage value Vpeak, amplitude bias control circuit 104 can alter a bias control voltage Vbc generated on bias control node 114.

Output amplifier circuit 106 can amplify a bias control voltage Vbc to generate an output signal Vref. In response to voltage Vref, amplifier bias current source 108 can alter a drive bias current I DRIVE, and thereby increase or decrease the amplitude of an oscillating signal.

In the above arrangement, an amplitude bias control circuit 104 can provide selectable bias points for amplitude control according to resistance values R10 and R12. Such an arrangement can enable an amplitude setting (Vbc) to be set with respect to ground. In this way, even at lower supply voltages, a wide range of bias points can be available. This can provide a usable bias point range that is close to a low power supply voltage, which can be advantageous for NMOS type amplifiers.

It is also noted that in an arrangement like that of FIG. 1, a resistance R10 and R12 can be established by a number of resistors, thus dividing up the gate-to-source voltage Vgs seen by n-channel transistors in the circuit. By doing so, effects of process variation on a threshold voltage of M10 can be reduced.

It is noted that in alternate embodiments, a bias control transistor can be a p-channel device, and an amplitude bias control circuit containing such a p-channel device can provide an amplitude bias voltage between a p-channel threshold voltage and a high power supply voltage. Such an arrangement can be advantageous for a PMOS type amplifier.

Figure 2:
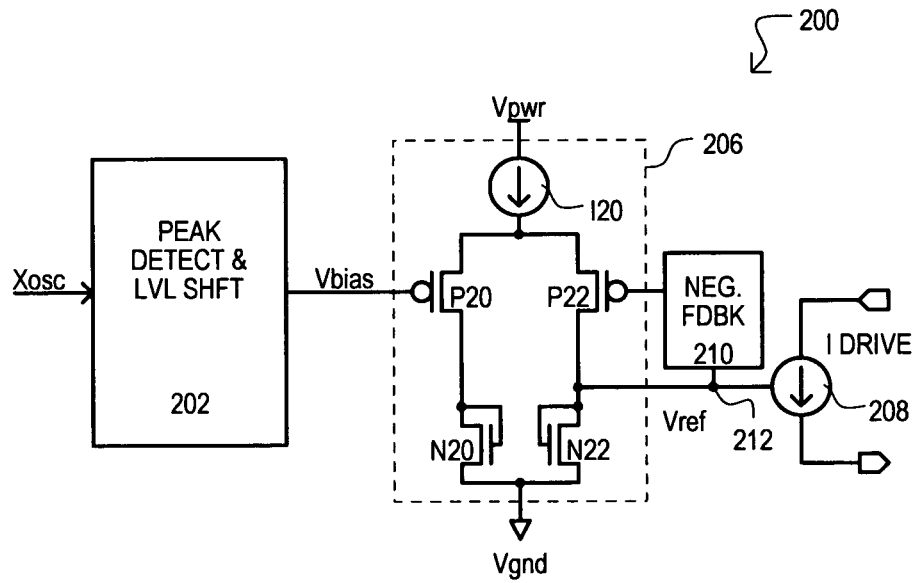
FIG. 2 is a block schematic diagram of an amplitude control circuit according to a second embodiment of the present invention.

An amplitude control circuit according to a second embodiment is set forth in block schematic diagram in FIG. 2, and designated by the general reference character 200. An amplitude control circuit 200 can include a peak level detect and level shift circuit 202, an output amplifier 206, an amplifier drive current source 208, and a negative feedback loop 210.

A peak level detect and level shift circuit 202 can generate a bias voltage Vbias that can correspond to a peak amplitude of a received oscillator signal Xosc. A bias voltage Vbias can be dependent upon a threshold voltage of a first conductivity type transistor. That is, variations due to process, operating conditions and voltage that affect such a threshold voltage can be reflected in a resulting bias voltage Vbias.

An output amplifier 206 can include a bias current source I20, a pair of differential transistors P20/P22, and load transistors N20/N22. A bias current source I20 can provide a current source to differential pair P20/P22. A first differential transistor P20 can have a source-drain connected between current source I20 and load device N20, and a gate that receives bias voltage Vbias. A second differential transistor P22 can have a source-drain connected between current source I20 and load device N22, and a gate coupled to negative feedback circuit 210. Load devices N20/N22 can be transistors connected in "diode" configuration (gates coupled to their respective drains). An output voltage Vref can be generated at a regulation voltage node 212 formed at the drain-drain connection of transistors P22 and N22. Transistors N20/N22 can be of the same conductivity type as that utilized to generate the bias voltage Vbias.

In a preferred embodiment, differential transistors P20/P22 can be p-channel transistors, and load devices can be n-channel transistors.

A negative feedback circuit 210 can provide negative feedback for differential transistor P22. In particular, as a potential at node 212 begins to fall (transistor P22 sources less current), negative feedback circuit 210 can lower the potential applied to the gate of transistor P22. Conversely, as a potential at node 212 rises (transistor P22 sources more current), negative feedback circuit 210 can raise the potential applied to the gate of transistor P22. Amplifier drive current source 208 can alter a drive current I DRIVE in response to an output voltage Vref, and thereby increase or decrease the amplitude of an oscillating signal.

In the above arrangement, a voltage generated across diode connected transistor N22 can serve to mirror variations in Vbias, as both are based on the same type transistor. This can remove variations that might otherwise occur when other biasing arrangements are utilized. That is, an amplifier bias on voltage (Vref) can correlate to an amplitude bias voltage Vbias.

The above arrangement can also allow an amplitude control circuit 200 to operate at lower supply potentials as variations in amplifier control Vref are reduced with respect to a bias voltage Vbias.

Figure 3:
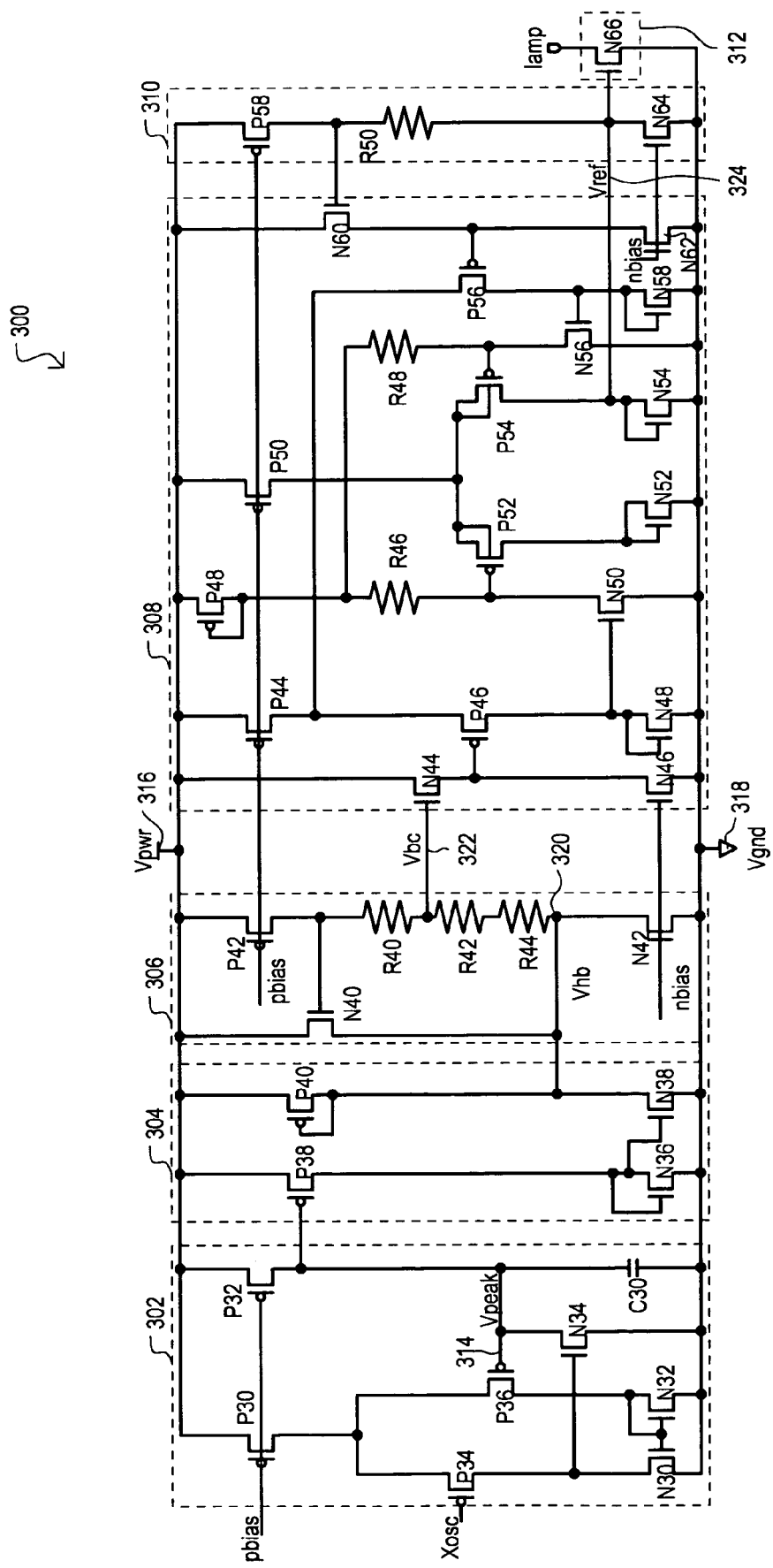
FIG. 3 is a detailed schematic diagram of an amplitude control circuit according to a third embodiment of the present invention.
Figure 4:
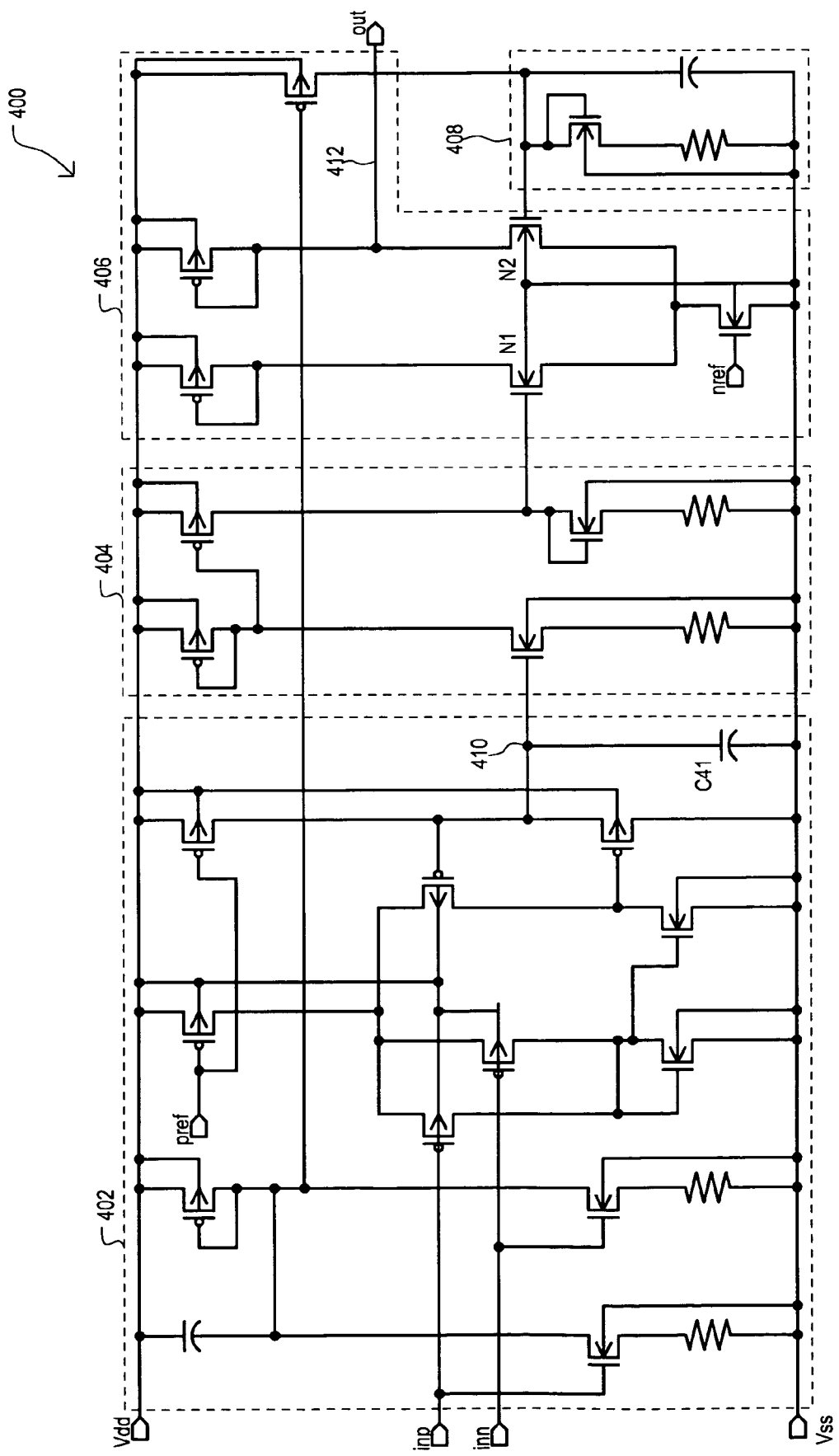
FIG. 4 is a block schematic diagram of a previously known amplitude control circuit.

Referring now to FIG. 3, an amplitude control circuit according to a third embodiment is set forth in a schematic diagram in FIG. 3, and designated by the general reference character 300. An amplitude control circuit 300 can include a peak detect circuit 302, a level shift circuit 304, an amplitude bias circuit 306, an output differential amplifier circuit 308, a feedback and level shifting circuit 310, and a current drive circuit 312. A peak level detect circuit 302 can include current source transistors P30/P32, differential pair transistors P34/P36, load transistors N30/N32, drive transistor N34, and capacitor C30. Current source transistors P30/P32 can receive a bias voltage pbias at a level between a high power supply voltage Vpwr and a low power supply voltage Vgnd. Transistor P30 can provide a bias current to sources of differential pair P34/P36. Transistor P32 can provide a bias current to charge capacitor C30.

Differential transistor P34 can receive an oscillator signal (Xosc) that can vary from a low power supply voltage Vgnd. When transistor P34 turns on, drive transistor N34 can be turned on, driving a voltage stored at node 314 to match the input potential Xosc at its closest excursion to negative supply potential Vgnd. Transistor P36 can have a gate coupled to node 314. In such an arrangement, a voltage at node 314 can be generated by transistor P32 charging capacitor C30. However, when signal Xosc reaches a peak value, transistor N34 can be turned on, discharging node 314 to a peak voltage value.

A level shift circuit 304 can include a first leg formed by transistors P38 and N36, and a second leg formed by transistors P40 and N38. Transistor P38 can have a source connected to a high power supply node 316 and a gate connected to node 314. Transistor N36 can be a load device, connected in a diode configuration with gate and drain connected to the drain of transistor P38 and a source connected to a low power supply node 318. Transistor N38 can have a source connected to a low power supply node 318 and a gate connected to the drain-drain connection of P38/N36. Transistor P40 can be a load device, connected in a diode configuration with gate and drain connected to the drain of transistor N38 and a source connected to a high power supply node 316.

In such an arrangement, a voltage Vpeak can be level shifted to generate a voltage Vhb at a node 320.

An amplitude bias circuit 306 can include a current source transistor P42, an amplitude control transistor N40, resistors R40, R42, R44, and bias transistor N42. Transistor P42 can have a source connected to a high power supply node 316 and a gate that receives bias voltage pbias. Transistor N40 can have a drain connected to a high power supply node 316, a gate connected to a drain of transistor P42, and a source connected to node 320. Resistor R40 can be connected between the gate of transistor N40 and an amplitude bias control node 322. Resistors R42 and R44 can be connected in series between node 322 and node 320. Transistor N42 can have a source-drain path between node 320 and low power supply voltage node 318, and a gate that receives a bias voltage nbias.

An amplitude bias circuit 306 can generate a bias control voltage Vbc at node 322 in the same general fashion as described above in FIG. 1 with respect to item 104. Thus, amplitude bias circuit 306 can provide a bias point with reference to a low power supply voltage Vgnd that is adjustable by positioning node 322 at a selected point within a divided resistance between gate of transistor N40 and node 320. This provides a range of bias setting points with respect to a low power supply voltage Vgnd.

An output differential amplifier circuit 308 can include a differential amplifier circuit that includes a current source transistor P50, differential pair P52/P54, and load transistors N52 and N54. This differential amplifier circuit can operate in the same general fashion as described in FIG. 2 with reference to 204. Thus, a control voltage Vref for establishing an operating current of an amplifier can be generated at node 324 that tracks variations in n-channel devices.

Output differential amplifier circuit 308 also includes input circuitry on both sides of differential pair P52/P54. On an input side (side with transistor P52), input circuitry can include transistors N44/N46, P44/P46/N48 and P48/N50 and resistor R46. Transistor N44 can have a drain connected to a high power supply voltage node 316, a gate coupled to node 322, and transistor N46 can have a drain connected to the source of transistor N44, a gate connected to bias voltage nbias, and a source connected to low power supply voltage 318.

Transistor P44 can have a source connected to a high power supply voltage node 316 and a gate that receives a bias voltage pbias. Transistor P46 has a source connected to the drain of transistor P44 and a gate connected to the drain-drain connection of transistors N44/N46. Transistor N48 can be connected in a diode configuration between the drain of transistor P46 and a low power supply node 318.

Transistor P48 can be connected in a diode configuration to a high power supply node 316. Resistor R46 can be connected between the gate-drain connection of transistor P48 and the drain of transistor N50. Transistor N50 can have a drain connected to resistor R46, a gate connected to the gate/drain connection of transistor N48, and a source connected to a low power supply node 318. A first input of differential pair P52/P54 can be connected to the drain of transistor N50.

On an output side (side with transistor P54), input circuitry can mirror the arrangement of the input side, and include transistors N60/N62, P44/P56/N58 and P48/N56 and resistor R48.

A feedback circuit 310 can include transistor P58, N64 and resistor R50. Transistor P58 can have a source connected to high power supply node 316 and a gate connected to bias voltage pbias. Resistor R50 can be connected between the drain of transistor P58 and node 324, which provides Vref. Transistor N64 has a drain connected to node 324, a gate that receives bias voltage nbias, and a source connected to low power supply node 318.

In such an arrangement, feedback 310 can drive a gate of transistor N60 according to potential Vref.

A current drive circuit 312 can include an n-channel transistor N66 having a drain that provides a current connection for an amplifier, a gate connected to node 324, and a source connected to a low power supply node 318.

In this way, a current lamp can be generated in response to a detected peak voltage according to changes occurring a diode connected n-channel device. Bias levels for generating the current lamp can correlate to a threshold voltage of an-channel device.

Figure 5:
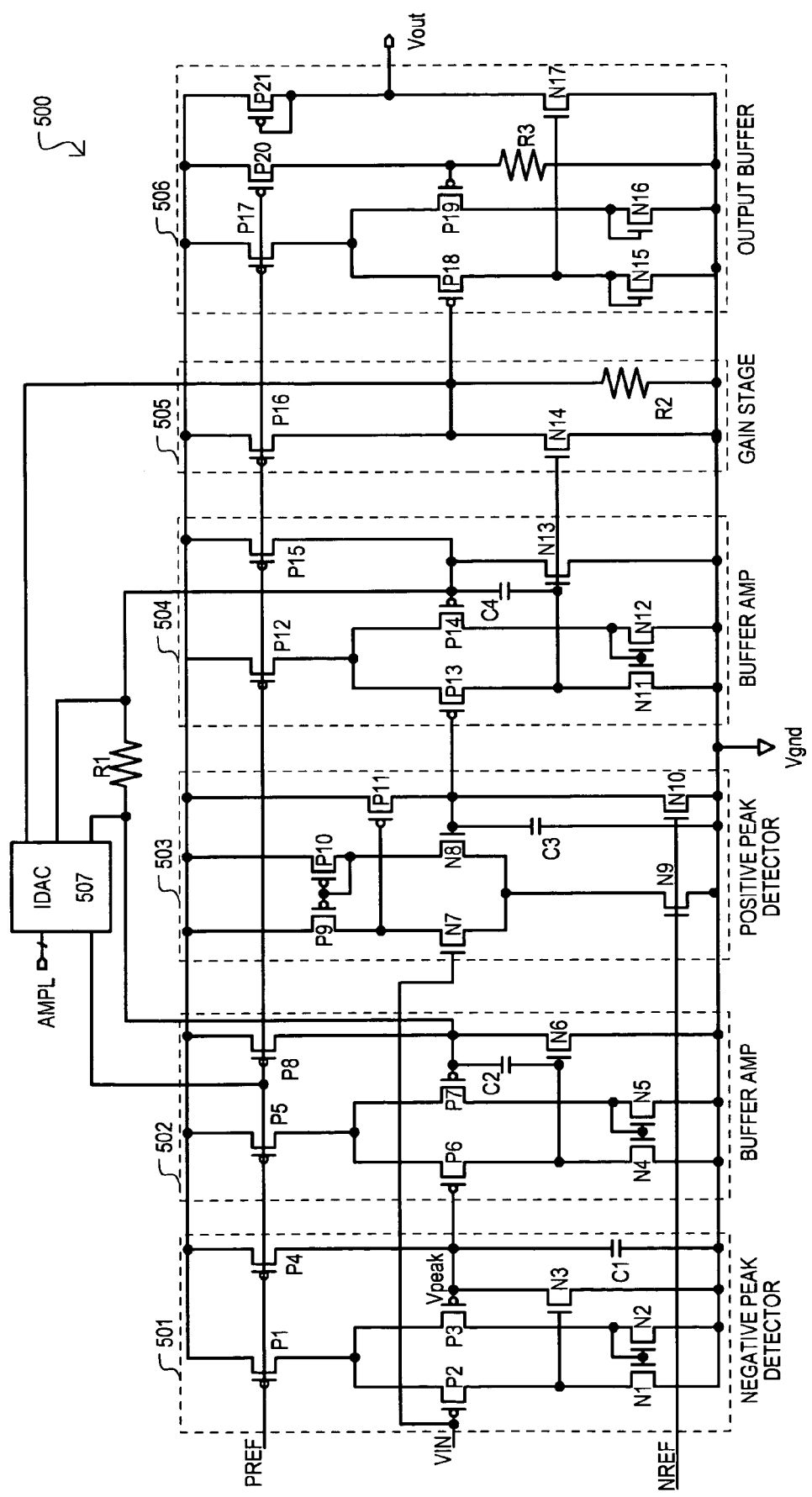
FIG. 5 is a detailed schematic diagram of an amplitude control circuit according to a fourth embodiment of the present invention.

Referring now to FIG. 5 an amplitude control circuit according to a fourth embodiment is set forth in a schematic diagram in FIG. 5, and designated by the general reference character 500. An amplitude control circuit can include a peak detector for capturing negative peak voltages 501, a buffer amplifier for the negative peak detector output 502, a peak detector for capturing positive peak voltages 503, a buffer amplifier for the positive peak detector 504, a gain stage 505, an output stage 506, and an amplitude set network 507 for setting the desired value of peak to peak voltage magnitude of the oscillator.

A negative peak detector 501 can be comprised of a p-channel insulated gate field effect transistor (referred to herein as PMOS) input source coupled differential pair P2/P3, with drains connected to drain terminals of n-channel MOS (NMOS) devices of an active load N1/N2 respectively, and biased by current source P1 connected to the common source terminals of devices P2 and P3. The gate of an amplifier device N3 may be connected to the common drains of devices P2 and N1 and have its drain connected to the gate of P3. Negative peak detector circuit 501 can be set to unity gain when the peak detector has input voltages at its input terminals which are nearly equal, with a current source device P4 providing a small "droop" current with its drain connected to the drain of N3 and gate of P3. Load device N2 may be diode connected to set the current in load device N1. A hold capacitor C1 may be connected between the gate of P3, the drain of N3, the drain of and P4 and ground (e.g., a low power supply voltage). The high current available in the drain of N3 allows the negative peak detector 501 to capture input voltages at the gate of P2 when that potential is lower than the hold voltage at the gate of P3, while the small current in the drain of P4 allows the circuit to track diminishing values of negative peak voltages. The ratio of the currents in the drains of devices P1 and P4 may be chosen to set a small droop rate relative to the period of oscillations of the input to the peak detector.

A buffer amplifier 502 may be comprised of a PMOS input source coupled differential pair of transistors P6/P7, with the common source terminal connected to a current source device P5. Input devices P6 and P7 may have their drains connected to the drains of active load devices N4 and N5 respectively. Device N5 may be diode connected to control the current in active load device N4. The common drains of devices P6 and N4 may be connected to the gate of amplifier device N6. The drain of N6 may be connected to the gate of P7, closing the amplifier loop in unity gain. Current source device P8 may have its drain connected to the drain of N6 and the gate of P7, with its current set to one half of the drain current in current source P5, forming a class "A" output operational amplifier with minimal built in input referred offset voltage. Capacitor C2 may be connected between the gate of P7 and the gate of N6 in order to stabilize the closed loop amplifier 502.

A positive peak detector 503 may be comprised of an NMOS source coupled differential pair of transistors N7/N8, with the gate of N7 connected to the input to the amplitude control circuit and transistor P2, a current source device N9 connected to the common sources of devices N7/N8, with the drains of devices N7 and N8 connected to the drains of active load devices P9/P10 respectively. Device P10 may be diode connected to set the current in load device P9. The common drains of devices N7 and P9 may be connected to the gate of an amplifier device P11. P11 may have its drain connected to the gate of device N8 to set unity gain when the input voltages to the positive peak detector are comparable. Current source device N10 may have its drain connected to the gate of N8 and the drain of P11, with its current set to a small "droop" current to allow the peak detector to capture diminishing values of positive peak voltage. Hold capacitor C3 may be connected to the common drains of devices P11 and N10 and the gate of N8 to hold the positive peak voltage.

A buffer amplifier 504 may be connected to the positive peak detector output and realized with devices P12-N13 and C4 identically to that described for buffer amplifier 502.

A resistor R1 may be connected between the outputs of buffer amplifiers 502 and 504, so that the difference voltage between positive and negative peak values of the input to the amplitude regulator may be converted into a current.

A gain stage 505 may be a scaled replica of the output stage of buffer amplifier 504, with the drain of current source device P16 connected to the drain of amplifier device N14, and the gate of N14 connected to the gate of amplifier device N13 in buffer amplifier 504. The common drains of gain stage devices P16 and N14 may be connected to ground through resistor R2. The scale factor between devices N14 and N13, multiplied by the scale factor between resistors R2 and R1, may set the gain of the amplitude regulator. A capacitor may be connected in parallel with resistor R2 to set the dominant pole of the amplitude regulator if desired.

An output stage 506 may be comprised of an input PMOS source coupled transistor pair P18/P19, with the gate of P18 connected to R2 and the common drains of P16 and N14 in gain stage 505. The gate of device P19 may be connected to ground through a resistor R3, and to the drain of a current source device P20, with the product of the drain current of P20 and the resistance of R3 equal to a reference voltage which may be chosen to provide sufficient voltage between the gates of P18/P19 and positive supply for the circuit to function linearly. Current source device P17 may be connected to the common drains of devices P18/P19, and the value of this current will determine the initial value of the current in the amplifier driving the resonant network before oscillation amplitude grows sufficiently to allow the amplitude control circuit to regulate the magnitude of the oscillatory waveform. Diode connected devices N15 and N16 may be connected to the drains of devices P18 and P19 respectively. Output current source device N17 may have its gate connected to the gate-drain of device N15 drain and the drain of P18, and its drain may be connected to output reference diode device P21.

In this implementation an NMOS Pierce oscillator is biased by a PMOS current source which is in turn biased by the voltage on PMOS diode device P21 in the amplitude regulator 500.

An amplitude set network may be implemented with a block of three current DACs 507. Two matched current sources may be connected across the terminals of R1, so that when the gate voltages of P18 and P19 are equal, the output stages of buffer amplifiers 502 and 504 are at balance, neither sinking nor sourcing current through R1, reducing systematic offset in the amplitude regulator 500. A third current source is connected to resistor R2, providing an offset voltage which determines the magnitude of peak to peak oscillations on the resonant network. All three current sources are realized with current digital-to-analog converters (DACs), the currents on the terminals of R1 are equal and of opposite polarity, and the current on R2 is equal to that on R1s terminals multiplied by the ratio of R2 to R1, and all current outputs are controlled by an N bit digital word which sets the magnitude and resolution of available amplitude settings.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An amplitude control circuit, comprising:
a first peak detector circuit configured to generate a first peak voltage signal corresponding to a first peak voltage of an input signal, wherein the first peak voltage of the input signal is a largest difference between the input signal and a first reference potential;
a second peak detector circuit configured to generate a second peak voltage signal corresponding to a second peak voltage of the input signal, wherein the second peak voltage is a largest difference between the input signal and a second reference potential; and
an output differential amplifier comprising a differential pair of output drive transistors of a first conductivity type, each output drive transistor having a drain coupled to a power supply node by a diode connected transistor of a second conductivity type, a first of the output drive transistors having a gate coupled to the first peak voltage signal and at least a first amplitude setting current source.

2. The amplitude control circuit of claim 1, wherein:
the at least first peak detector circuit includes a positive peak detector section comprising an input differential pair that includes
a first input transistor having a gate coupled to receive the input signal,
a second input transistor having a gate coupled to a first terminal of a first hold capacitor, and
a peak leveling device that creates a current path between the first terminal of the first hold capacitor and a power supply node in response to the potential at the drain of the first input transistor.

3. The amplitude control circuit of claim 2, wherein:
the first and second input transistors comprise p-channel insulated gate field effect transistors; and
the peak level device comprises an n-channel transistor having a gate coupled to the drain of the first input transistor and a drain coupled to the gate of the second input transistor.

4. The amplitude control circuit of claim 2, wherein:
the at least first peak detector further includes a negative peak detector section comprising an input differential pair that includes
a third input transistor having a gate coupled to receive the input signal,
a fourth input transistor having a gate coupled to a first terminal of a second hold capacitor, and
a peak level device that creates a current path between the first terminal of the second hold capacitor and a power supply node in response to the potential at the drain of the first input transistor.

5. The amplitude control circuit of claim 4, further including:
a first buffer amplifier that buffers a potential at the first terminal of the first hold capacitor; and
a second buffer amplifier that buffers a potential at the first terminal of the second hold capacitor.

6. The amplifier control circuit of claim 1, wherein:
an amplitude selection section, comprising
an amplitude control transistor having a drain coupled to a first power supply node, a source coupled to the peak voltage signal, and
a plurality of resistors coupled in series between the gate of amplitude control transistor and a source of the amplitude control transistor.

7. The amplitude control circuit of 6, wherein:
the amplitude control transistor comprises an n-channel transistor, and the first power supply node is a high power supply node.

8. The amplitude control circuit of 6, wherein:
the amplitude control transistor comprises a p-channel transistor, and the first power supply node is a low power supply node.

9. The amplitude control circuit of claim 1, wherein:
at least a first current source that provides the amplitude setting current source.

10. The amplitude control circuit of claim 9, wherein:
the at least first current source comprises a current digital-to-analog converter.

11. An amplitude control circuit, comprising:
an amplifier drive current source that provides a drive current in response to a control signal at a control node;
an output drive amplifier that generates the control signal in response to an amplitude bias signal;

an amplitude setting circuit, comprising
  at least a first current source that provides a first current, the control node voltage change in response to changes in the first current;
  a first peak detector circuit that generates a first output voltage at a first hold node corresponding to a first peak voltage of an input signal, the first peak voltage being a largest difference between the input signal and a first reference potential; and
  second peak detector circuit that generates a second output voltage at a second hold node corresponding to a second peak voltage of the input signal, the second peak voltage being a largest difference between the input signal and a second reference potential.

12. The amplitude control circuit of claim 11, wherein:
the output drive amplifier comprises a differential pair of output drive transistors of one conductivity type, each output drive transistor having a drain coupled to one of the power supply nodes by a diode connected transistor of another conductivity type, a first of the output drive transistors having a gate coupled to receive the amplitude bias signal, a second of the output drive transistors having a drain that provides the control signal; and
the drive current source comprises a drive transistor having a gate coupled to receive the control signal.

13. The amplitude control circuit of claim 11, wherein:
the first peak voltage is coupled to a second peak voltage by a resistance.

14. The amplitude control circuit of claim 11, wherein:
the amplitude setting circuit further includes
the first current source being coupled to the first hold node, and
a second current source coupled to the second hold node.

15. The amplitude control circuit of claim 11, wherein:
the first peak detector circuit and second peak detector each includes a differential amplifier output stage.

16. The amplitude control circuit of claim 11, wherein:
the amplitude setting circuit further includes an offset current source coupled to the control node.

17. An amplitude control circuit, comprising:
at least a first peak level detect means for detecting a peak voltage of an input signal;
amplitude bias means for generating an amplitude bias voltage from a plurality of resistors coupled between a gate and a source of an amplitude bias transistor; and
means for generating a current control voltage across a diode connected transistor based on amplitude bias voltage.

18. The amplitude control circuit of claim 17, wherein:
the means for generating a current control voltage includes differential amplifying means for amplifying the bias voltage to generate the current control voltage.

19. The amplitude control circuit of claim 17, further including:
negative feedback means for reducing the current control voltage in response to increasing in the current control voltage and increasing the current control voltage in response to decreases in the current control voltage.

20. The amplitude control circuit of claim 17, further including:
the peak level detect means includes differential transistors of a first conductivity type; and
level shifting means for level shifting a peak voltage signal from the peak level detect means from an input signal generated across a load transistor of a second conductivity type, to an output signal generated across a load transistor of the first conductivity type.

* * * * *